US012804804B2

(12) United States Patent
Tu et al.

(10) Patent No.: US 12,804,804 B2
(45) Date of Patent: Nov. 17, 2026

(54) FLEXIBLE CIRCUIT BOARD

(71) Applicant: CHIPBOND TECHNOLOGY CORPORATION, Hsinchu (TW)

(72) Inventors: Kung-Tzu Tu, Kaohsiung City (TW); Gwo-Shyan Sheu, Kaohsiung City (TW); Hsin-Hao Huang, Kaohsiung City (TW); Pei-Wen Wang, Taichung City (TW); Yu-Chen Ma, Kaohsiung City (TW); Erh-Shun Chuang, Kaohsiung City (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 244 days.

(21) Appl. No.: 18/789,994

(22) Filed: Jul. 31, 2024

(65) Prior Publication Data

US 2025/0071889 A1 Feb. 27, 2025

(30) Foreign Application Priority Data

Aug. 25, 2023 (TW) ................................ 112132204

(51) Int. Cl.
*H05K 1/02* (2006.01)
*G01R 1/073* (2006.01)
(Continued)

(52) U.S. Cl.
CPC ....... *H05K 1/0277* (2013.01); *G01R 1/07342* (2013.01); *H05K 1/0268* (2013.01); *H05K 1/111* (2013.01); *H05K 1/189* (2013.01)

(58) Field of Classification Search
CPC ...... H05K 1/02; H05K 1/0268; H05K 1/0271; H05K 1/0277; H05K 1/07342; H05K 1/11;
(Continued)

(56) References Cited

U.S. PATENT DOCUMENTS 6,853,090 B2 * 2/2005 Kim ...................... H10P 74/273
257/784
9,437,526 B2 * 9/2016 Lim ...................... H05K 1/118
(Continued)

FOREIGN PATENT DOCUMENTS

CN 106255310 A 12/2016
CN 115707176 A 2/2023
(Continued)

OTHER PUBLICATIONS

Taiwanese notice of allowance mailed Nov. 22, 2024 for Taiwanese patent application No. 112132204, 4 pages.
(Continued)

*Primary Examiner* — Tuan T Dinh

(74) *Attorney, Agent, or Firm* — Demian K. Jackson; Jackson IPG PLLC

(57) ABSTRACT

A flexible circuit board includes a flexible substrate, a chip, a first test area, first test pads and a circuit layer connected to the chip and the first test pads. A working area and a non-working area are defined on an upper surface of the flexible substrate. The chip is disposed on the working area, the first test area is located within the non-working area and between a third edge and the working area, the first test pads are arranged on the first test area. Flexible circuit boards with different sizes have the first test area with the same size and are tested using a probe card with the same specification to lower testing cost.

11 Claims, 7 Drawing Sheets

(51) Int. Cl.
*H05K 1/11* (2006.01)
*H05K 1/189* (2026.01)

(58) Field of Classification Search
CPC .............. H05K 1/111–118; H05K 1/18; H05K 1/185–189; H05K 3/4007; G01R 1/07378
USPC ........................ 361/749, 764, 767–778, 803; 174/254–262
See application file for complete search history.

(56) References Cited

U.S. PATENT DOCUMENTS

| | | | | |
|---|---|---|---|---|
| 2006/0181299 | A1* | 8/2006 | Hirae | H10P 74/273 324/762.04 |
| 2017/0092572 | A1* | 3/2017 | Cheng | H10P 74/273 |
| 2017/0223824 | A1 | 8/2017 | Ono | |
| 2019/0348357 | A1* | 11/2019 | Lee | G01R 31/2644 |
| 2019/0371691 | A1* | 12/2019 | Han | G02F 1/13452 |
| 2021/0045229 | A1 | 2/2021 | Lim et al. | |
| 2022/0149027 | A1* | 5/2022 | Im | G09G 3/006 |
| 2023/0104777 | A1* | 4/2023 | Park | H05K 1/0268 361/749 |

FOREIGN PATENT DOCUMENTS

| | | | |
|---|---|---|---|
| JP | 2019-079032 | A | 5/2019 |
| KR | 10-2019-0045037 | A | 5/2019 |
| TW | 201328456 | A | 7/2013 |
| TW | 201425952 | A | 7/2014 |
| TW | 202021431 | A | 6/2020 |
| TW | 202210885 | A | 3/2022 |
| TW | 202316156 | A | 4/2023 |

OTHER PUBLICATIONS

Japanese office action mailed Jun. 30, 2025 for Japanese patent application No. 2024-130818, 3 pages.
Korean office action mailed Aug. 11, 2025 for Korean patent application No. 10-2024-0105100, 7 pages.

* cited by examiner

FLEXIBLE CIRCUIT BOARD

CROSS-REFERENCE TO RELATED APPLICATIONS

This application claims priority to R.O.C Patent Application No. 112132204 filed Aug. 25, 2023, the disclosure of which is hereby incorporated by reference in its entirety.

FIELD OF THE INVENTION

This invention relates to a flexible circuit board, and more particularly to a flexible circuit board having test pads.

BACKGROUND OF THE INVENTION

Flexible circuit boards are extensively applied in consumer electronics due to flexibility and small size, but it is not easy to directly test fine circuit lines on the flexible circuit boards during fabrication. For this reason, test pads larger in width than the fine circuit lines are arranged on upper and lower sides of the flexible circuit boards where are outside routing area, and a probe card is used to contact the test pads for electrical testing. Flexible circuit boards for different requirements may have different sizes, for example, distances from the upper side to the lower side of the flexible circuit boards are different, that means probe cards with different specifications are required for testing flexible circuit boards with different sizes and the cost for testing the flexible circuit boards is increased. Additionally, the distance from the upper side to the lower side of the larger flexible circuit board is longer, and the probe card only can test one or two flexible circuit boards every time so testing process may spend more time.

SUMMARY OF THE INVENTION

One object of the present invention is to provide a test area between a third edge of a flexible substrate and a working area defined on the flexible substrate. Size of the test area has not to be changed for different flexible substrates so a probe card with the same specification can be used for the flexible substrates with different sizes.

A flexible circuit board of the present invention includes a flexible substrate, a chip, a first test area, first test pads and a circuit layer. The flexible substrate has an upper surface, a first edge, a second edge, a third edge and a fourth edge, the third and fourth edges are located between the first and second edges. A working area and a non-working area surrounding the working area are defined on the upper surface, the working area has a first cutting side and a second cutting side which are parallel to the first and second edges of the flexible substrate. The chip is mounted on the working area and has two long sides parallel to the first and second edges of the flexible substrate, an active surface facing toward the upper surface and first bumps provided on the active surface, arranged along and nearby one of the two long sides. The first test area is located within the non-working area and between the third edge and the working area. The first test pads are arranged on the first test area along the third edge. The circuit layer is provided on the upper surface and includes first outer lines, first circuit lines and first extension lines. The first outer lines are arranged along and nearby the first cutting side of the working area. Both ends of each of the first circuit lines are connected to one of the first bumps and one end of one of the first outer lines, respectively. Both ends of each of the first extension lines are connected to the other end of one of the first outer lines and one of the first test pads, respectively.

The first test area is designed to be between the third edge and the working area such that it is not necessary to change the first test area's size with size variation of the flexible circuit board, and the same probe card can be used for flexible circuit boards with different sizes, thereby lowering testing cost.

DETAILED DESCRIPTION OF THE INVENTION

Figure 1:
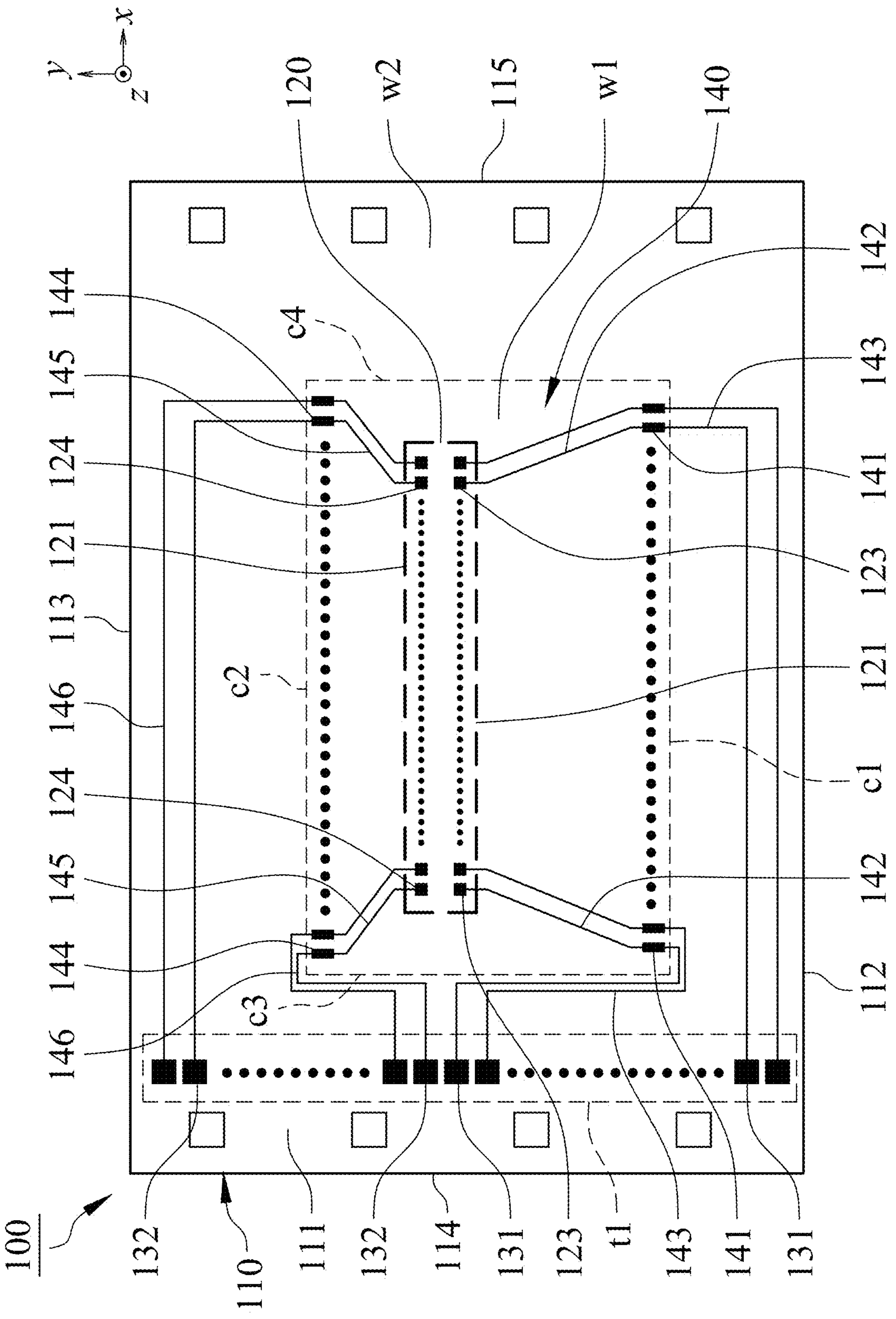
FIG. 1 is top view diagram illustrating a flexible circuit board in accordance with a first embodiment of the present invention.
Figure 2:
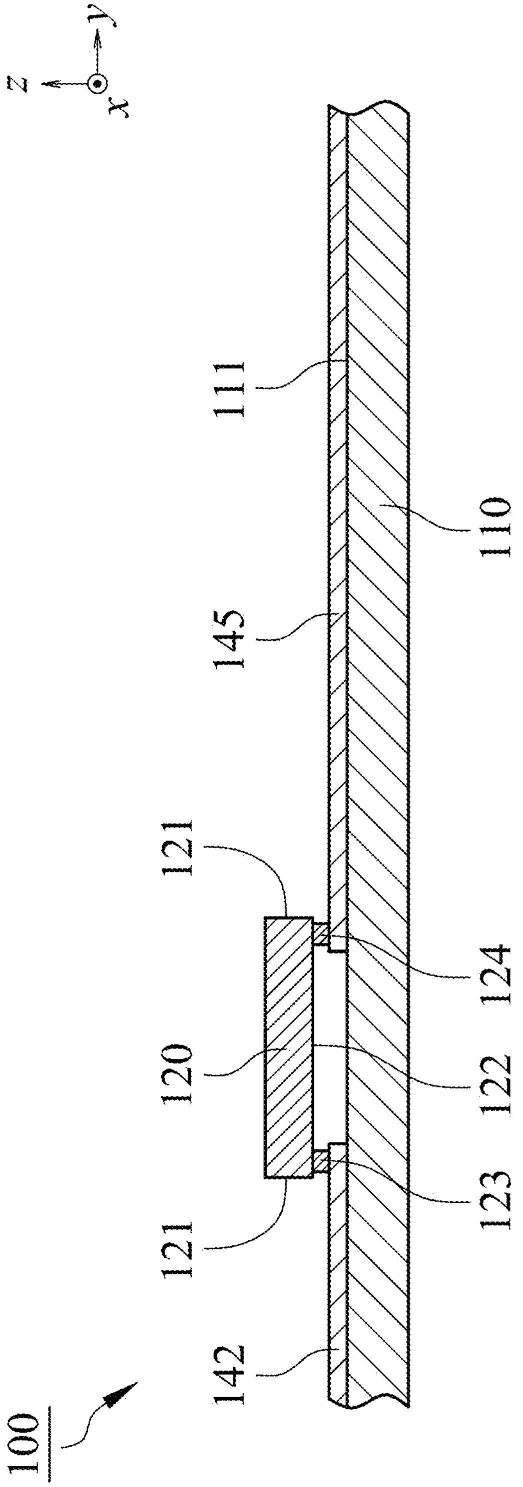
FIG. 2 is a cross-section view diagram illustrating a part of a flexible circuit board in accordance with a first embodiment of the present invention.

FIGS. 1 and 2 illustrate a first embodiment of the present invention. A flexible circuit board 100 includes a flexible substrate 110, a chip 120, a first test area t1, first test pads 131, second test pads 132 and a circuit layer 140. The flexible substrate 110 has an upper surface 111, a first edge 112, a second edge 113, a third edge 114 and a fourth edge 115. The third and fourth edges 114 and 115 are located between the first and second edges 112 and 113, and the first to fourth edges 112, 113, 114 and 115 encircle the upper surface 111. Taking the flexible circuit board 100 shown in FIG. 1 for example, the first and second edges 112 and 113 are bottom and top edges of the upper surface 111, respectively, and the third and fourth edges 114 and 115 are left and right edges of the upper surface 111, respectively.

A working area w1 and a non-working area w2 are defined on the upper surface 111, the working area w1 is provided in the middle of the upper surface 111 and surrounded by the non-working area w2. Referring to FIG. 1, the area encircled by the dash line is the working area w1 and it will be cut from the flexible circuit board 100 as an actual circuit board, and the area outside the dash line is the non-working area w2. The working area w1 is a rectangular area in the first embodiment, and it may be different shape in other embodiments. The working area w1 has a first cutting side c1, a second cutting side c2, a third cutting side c3 and a fourth cutting side c4. The first and second cutting sides c1 and c2 are parallel to the first and second edges 112 and 113, and the third and fourth cutting sides c3 and c4 are parallel to the third and fourth edges 114 and 115.

The chip 120 is mounted on the working area w1 and includes two long sides 121, an active surface 122, first bumps 123 and second bumps 124. The two long sides 121 of the chip 120 are parallel to the first and second edges 112 and 113 of the flexible substrate 110, the active surface 122 faces toward the upper surface 111 of the flexible substrate 110, the first bumps 123 are provided on the active surface 122, arranged along and nearby one of the two long sides 121, and the second bumps 124 are provided on the active surface 122, arranged along and nearby the other long side 121. Only four first bumps 123 and four second bumps 124 are represented in top view diagrams, the other first and second bumps are simplified as black dots.

The first test area t1 is located within the non-working area w2 and between the third edge 114 and the working area w1. In the first embodiment, the first test area t1 is rectangular in shape and its long sides are parallel to the third edge 114. The first and second test pads 131 and 132 are arranged on the first test area t1 along the third edge 114. The first test pads 131 are closer to the first edge 112 than the second test pads 132, and the second test pads 132 are closer to the second edge 113 than the first test pads 131. Only four first test pads 131 and four second test pads 132 are shown in top view diagrams, the others are simplified as black dots. Furthermore, the first and second test pads 131 and 132 of the first embodiment are arranged in one row, and they can be arranged in more than one row in the other embodiment if space is not enough.

The circuit layer 140 is provided on the upper surface 111 of the flexible substrate 110 and includes first outer lines 141, first circuit lines 142, first extension lines 143, second outer lines 144, second circuit lines 145 and second extension lines 146. The first outer lines 141 are located within the working area w1, arranged along and nearby the first cutting side c1 of the working area w1. The first outer lines 141 will become outer leads provided to connect with a circuit board of other electronic device after cutting the working area w1 from the flexible circuit board 100, and only four first outer lines 141 are shown in drawings, the others are simplified as black dots. The first circuit lines 142 are located on the working area w1, and the first extension lines 143 are located on the non-working area w2. Both ends of each of the first circuit lines 142 are connected to one of the first bumps 123 and one end of one of the first outer lines 141, respectively. Both ends of each of the first extension lines 143 are connected to the other end of one of the first outer lines 141 and one of the first test pads 131, respectively. In order to simplify drawings, only four first circuit lines 142 and four first extension lines 143 are represented in drawings. In practice, each of the first bumps 123 and the corresponding first outer line 141 are connected by one first circuit line 142, and each of the first test pads 131 and the corresponding first outer line 141 are connected by one first extension line 143. In the first embodiment, the first test pads 131 are coupled with the first bumps 123 via the first outer lines 141, the first circuit lines 142 and the first extension lines 143 and provided to test whether electrical connections of the circuit lines and the first bumps 123 are abnormal.

The second outer lines 144 are located on the working area w1, arranged along and nearby the second cutting side c2 of the working area w1. The second outer lines 144 will become outer leads provided to connect with a circuit board of other electronic device after cutting the working area w1 from the flexible circuit board 100, and only four second outer lines 144 are represented in drawings, the others are simplified as black dots. The second circuit lines 145 are located on the working area w1 and the second extension lines 146 are located on the non-working area w2. Both ends of each of the second circuit lines 145 are connected to one of the second bumps 124 and one end of one of the second outer lines 144, respectively. Both ends of each of the second extension lines 146 are connected to the other end of one of the second outer lines 144 and one of the second test pads 132. There are only four second circuit lines 145 and four second extension lines 146 shown in drawings for simplification. Actually, each of the second bumps 124 and the corresponding second outer line 144 are connected by one second circuit line 145, and each of the second test pads 132 and the corresponding second outer line 144 are connected by one second extension line 146. Because of the second outer lines 144, the second circuit lines 145 and the second extension lines 146, the second test pads 132 can be coupled to the second bumps 124 and used to test whether electrical connections of the circuit lines and the second bumps 124 are abnormal.

In the first embodiment, the first test pads 131 and the second test pads 132 are provided on the first test area t1. Even through the flexible substrate 100 has to be larger in size for different requirements, the first test area t1 can have the same size through pattern design change. Thus, the same probe card can be used to test flexible circuit boards 100 with different sizes to lower testing cost.

Figure 3:
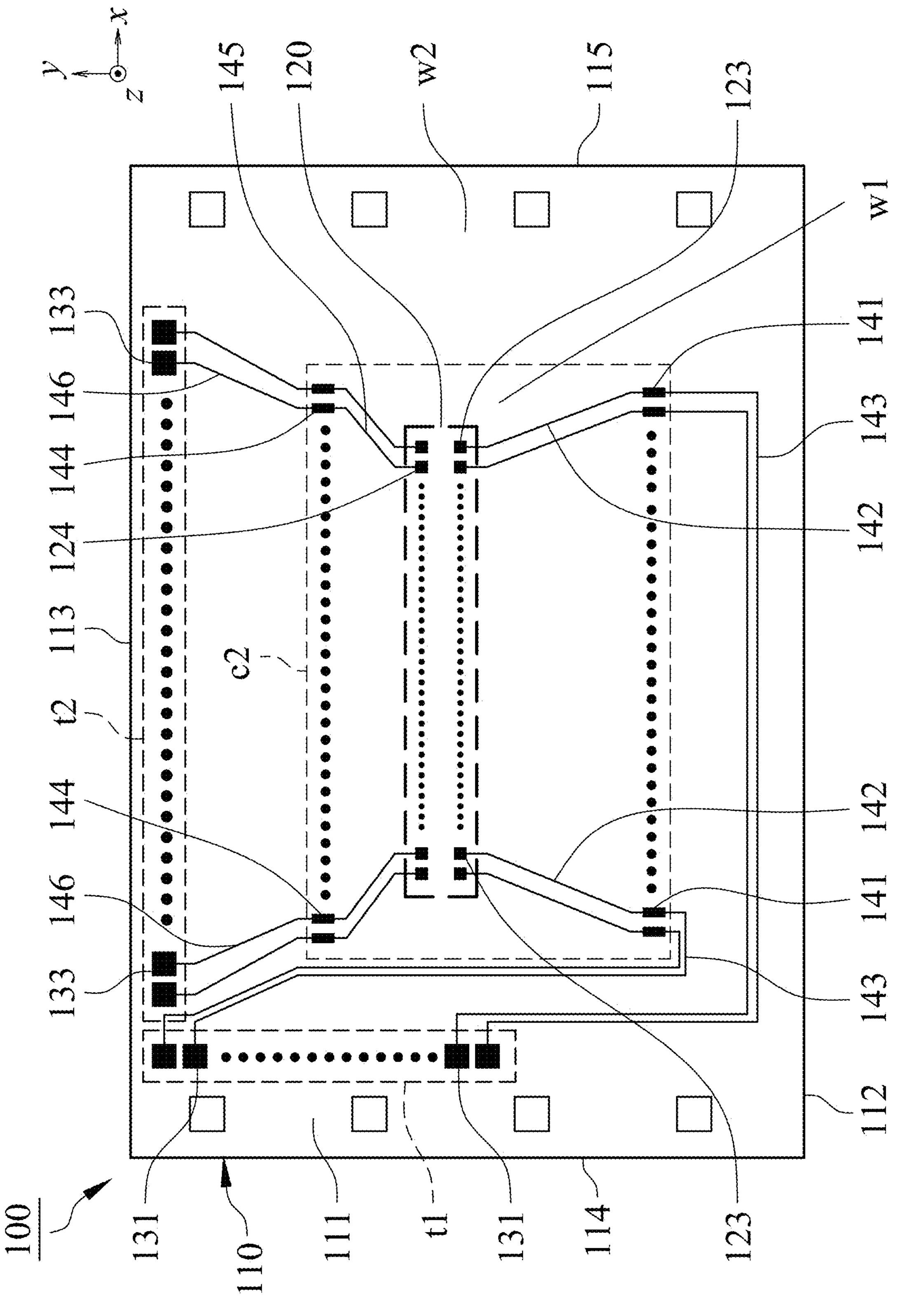
FIG. 3 is a top view diagram illustrating a flexible circuit board in accordance with a second embodiment of the present invention.

A second embodiment of the present invention is shown in FIG. 3. Different to the first embodiment, the flexible circuit board 100 of the second embodiment further includes a second test area t2 located within the non-working area w2 and between the second edge 113 and the second cutting side c2 of the working area w1. Preferably, the second test area t2 is rectangular in shape and its long side is parallel to the second edge 113.

In the second embodiment, the flexible circuit board 100 further includes third test pads 133 arranged on the second test area t2 along the second edge 113, and there are only the first test pads 131, without the second test pads 132, provided on the first test area t1. Accordingly, both ends of each of the second extension lines 146 are connected to the other end of one of the second outer lines 144 and one of the third test pads 133, respectively. If line density is too high to put all test pads on the first test area t1, the third test pads 133 can be put on the second test area t2, and electrical connection of the second outer lines 144, the second circuit lines 145 and the second bumps 124 can be tested through the third test pads 133 and the second extension lines 146. Preferably, the first test area t1 where only the first test pads 131 are put on can be designed to be located on upper half of the upper surface 111 and adjacent to the second test area t2 such that the first test pads 131 on the first test area t1 and the third test pads 133 on the second test area t2 can be tested simultaneously using the same probe card.

Figure 4:
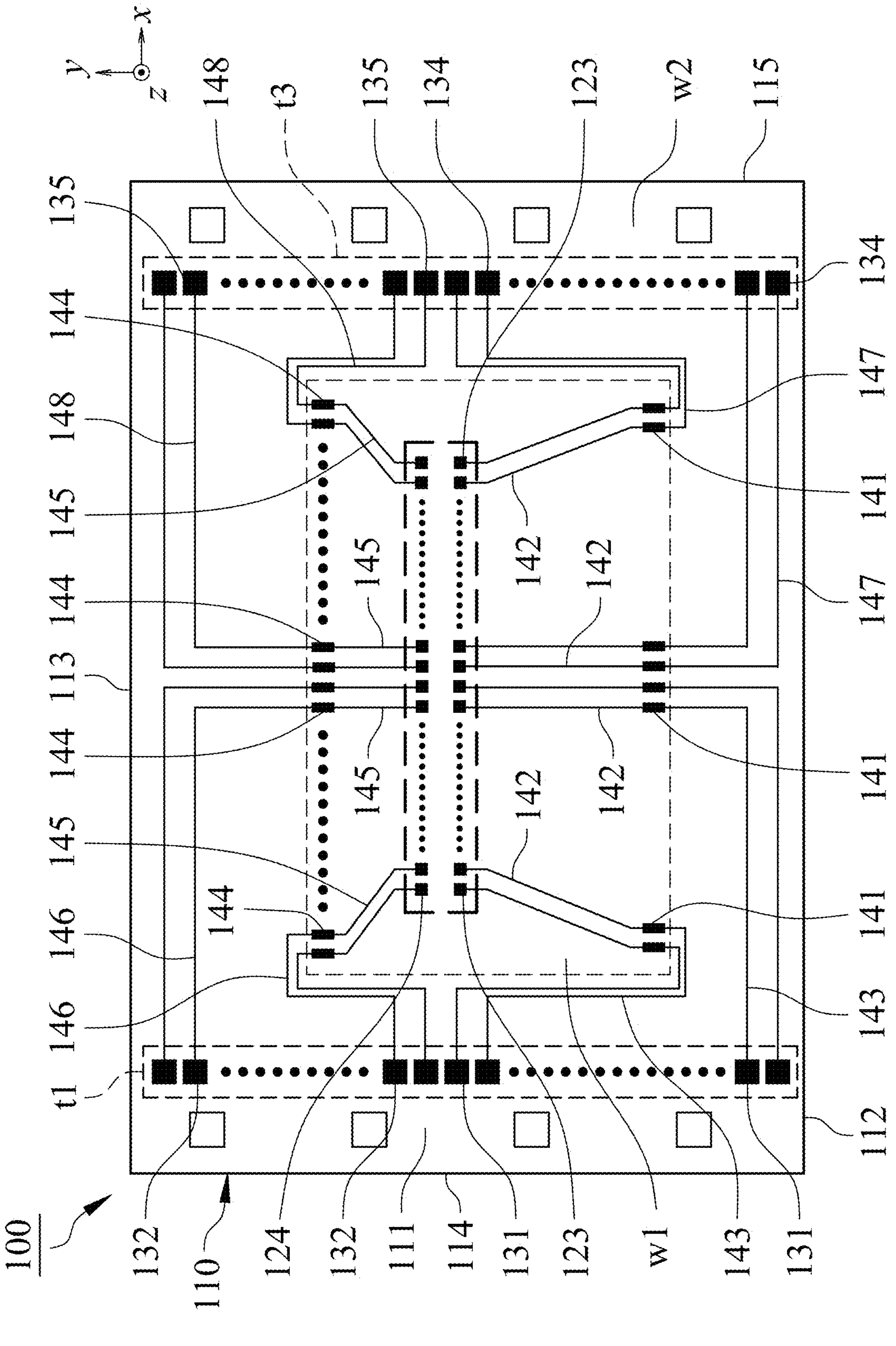
FIG. 4 is a top view diagram illustrating a flexible circuit board in accordance with a third embodiment of the present invention.

With reference to FIG. 4, different to the first embodiment, the flexible circuit board 100 of a third embodiment of the present invention further includes a third test area t3 located within the non-working area w2 and between the fourth edge 115 and the working area w1. In the third embodiment, the third test area t3 is designed to be rectangular and its long side is parallel to the fourth edge 115.

In the third embodiment, the first and second test pads 131 and 132 are provided on the first test area t1 and connected to the first and second outer lines 141 and 144, respectively, by the first and second extension lines 143 and 146.

The flexible circuit board 100 of the third embodiment further includes fourth test pads 134 and fifth test pads 135 arranged on the third test area t3 along the fourth edge 115. The circuit layer 140 further includes third extension lines 147 and fourth extension lines 148 in the third embodiment. Both ends of each of the third extension lines 147 are connected to the other end of one of the first outer lines 141 and one of the fourth test pads 134, respectively. And both ends of each of the fourth extension lines 148 are connected to the other end of one of the second outer lines 144 and one of the fifth test pads 135, respectively.

In the third embodiment, the test pads for the first bumps 123, the first outer lines 141 and the first circuit lines 142 and the test pads for the second bumps 124, the second outer lines 144 and the second circuit lines 145 are provided on the first test area t1 and the third test area t3 so as to solve the problem that a single test area is not enough for all test pads. Furthermore, owing to the first test area t1 and the third test area t3 of the third embodiment are located on left and right sides of the working area w1, respectively, different flexible circuit boards 100 in size can have the first test area t1 and the third test area t3 with the same size through pattern design and can be tested using the probe card with the same specification.

Figure 5:
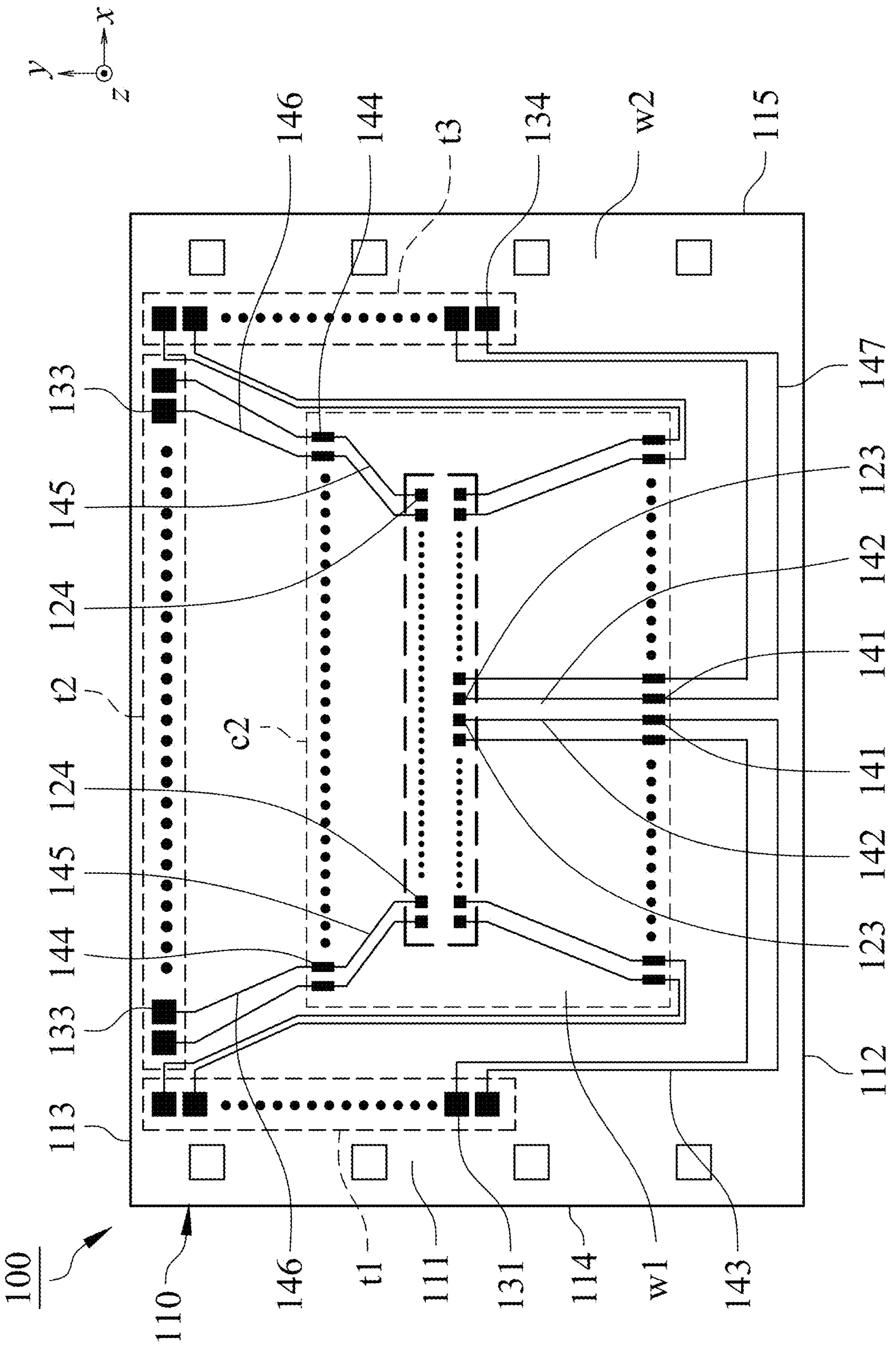
FIG. 5 is a top view diagram illustrating a flexible circuit board in accordance with a fourth embodiment of the present invention.

FIG. 5 is a top view diagram of the flexible circuit board 100 in accordance with a fourth embodiment of the present invention. Different to the third embodiment, the flexible circuit board 100 of the fourth embodiment further includes a second test area t2 located within the non-working area w2 and between the second edge 113 and the second cutting side c2 of the working area w1. Third test pads 133 are arranged on the second test area t2 along the second edge 113. Both ends of each of the second extension lines 146 are connected to the other end of one of the second outer lines 144 and one of the third test pads 133, respectively. Because the third test pads 133 are put on the second test area t2, there are only the first test pads 131 provided on the first test area t1 and only the fourth test pads 134 provided on the third test area t3. Hence, the first test area t1 and the third test area t3 can be located on upper half of the upper surface 111 and near the second test area t2, and the first test pads 131 located on the first area t1, the third test pads 133 located on the second test area t2 and the fourth test pads 134 located on the third test area t3 can be tested simultaneously using the same probe card.

Figure 6:
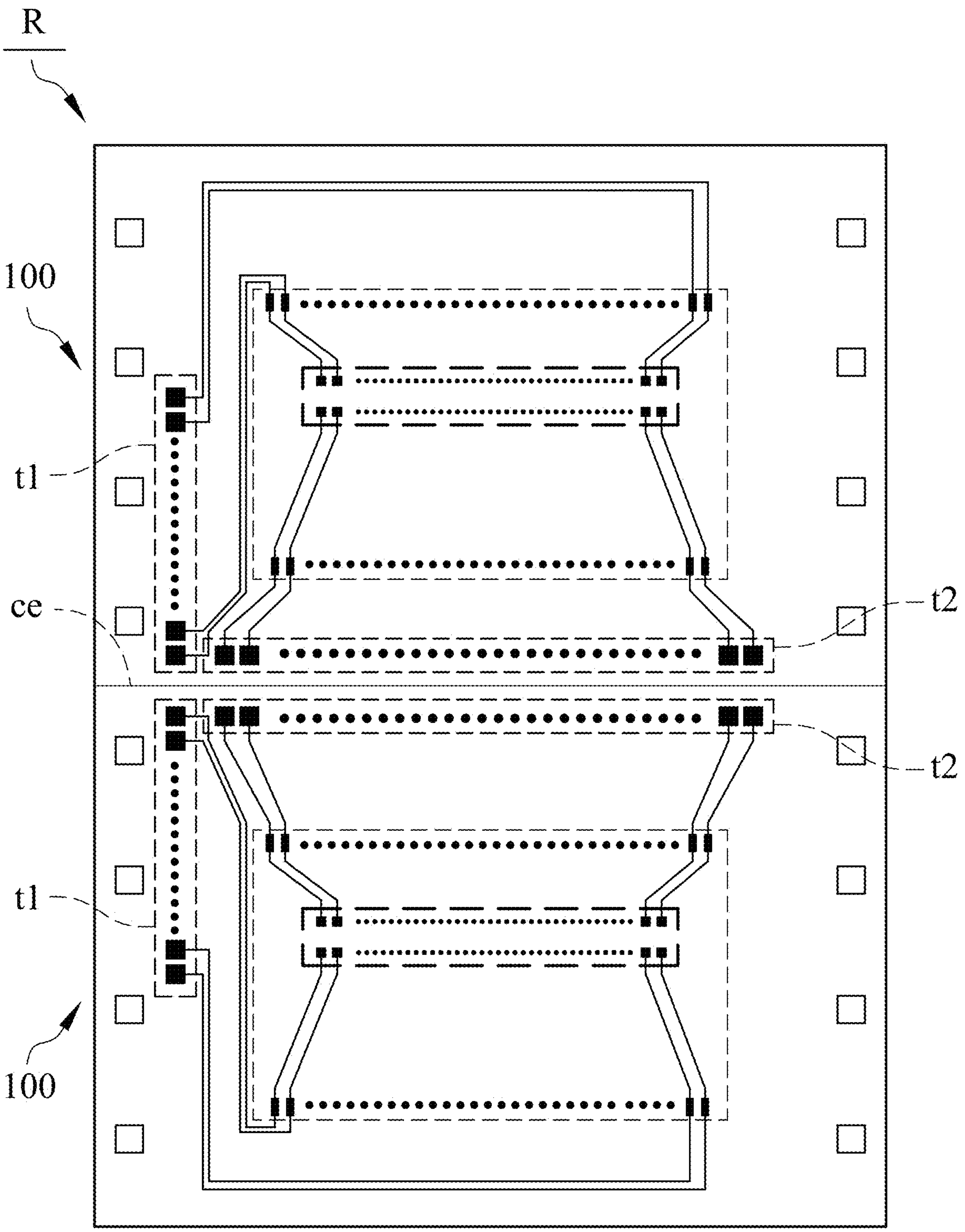
FIG. 6 is a top view diagram illustrating two flexible circuit boards connected with each other as a reel in accordance with a second embodiment of the present invention.

With reference to FIG. 6, multiple flexible circuit boards 100 of the second embodiment of the present invention are connected with each other as a reel R. There is a connection edge ce between the adjacent flexible circuit boards 100, and the first test areas t1 and the second test areas t2 of the adjacent flexible circuit boards 100 are mirror symmetric about the connection edge ce. The test pads of the second embodiment are gathered on the same half of the upper surface 111 of the flexible substrate 110 so the test pads on the two flexible circuit boards 100 can be tested by a single probe card simultaneously to speed up testing process and improve manufacturing efficiency.

Figure 7:
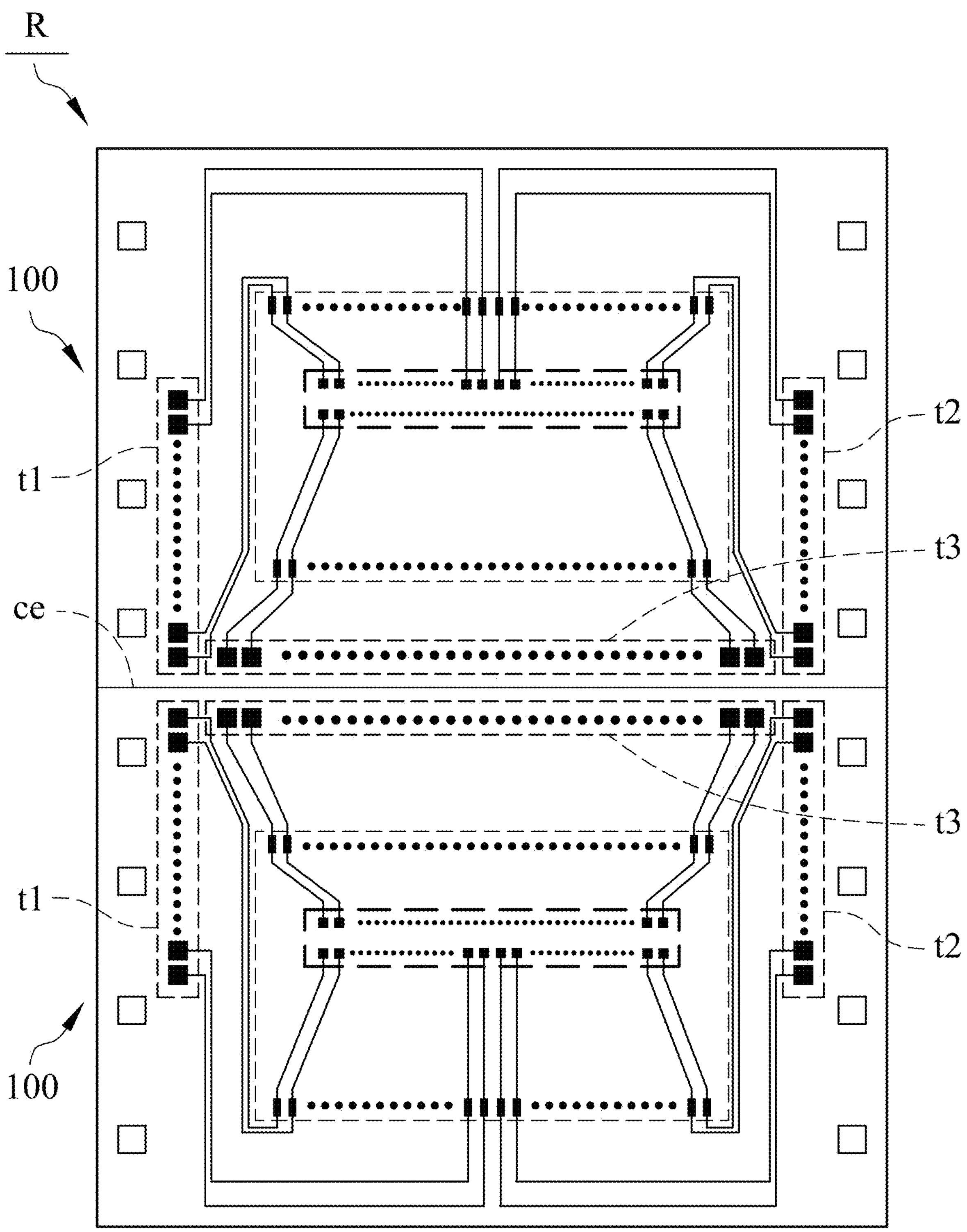
FIG. 7 is a top view diagram illustrating two flexible circuit boards connected with each other as a reel in accordance with a fourth embodiment of the present invention.

FIG. 7 shows a reel R including multiple flexible circuit boards 100 of the fourth embodiment of the present invention, which are connected with each other. A connection edge ce is located between the adjacent flexible circuit boards 100, and the first test areas t1 and the second test areas t2 of the adjacent flexible circuit boards 100 are mirror symmetric about the connection edge ce. The test pads are designed to be arranged on the same half of the upper surface 111 of the flexible substrate 110 in the fourth embodiment, as a result, a single probe card can be used to test the test pads on the two adjacent circuit boards 100 at the same time to improve manufacturing efficiency with less testing time.

The present invention designs to dispose the first test area t1 between the third edge 114 and the working area w1 such that flexible circuit boards 100 with different sizes can have the first test area t1 with the same size and can be tested by the probe card with the same specification to reduce testing cost.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

The invention claimed is:

1. A flexible circuit board comprising:

a flexible substrate including an upper surface and first to fourth edges, a working area and a non-working area are defined on the upper surface, the working area is surrounded by the non-working area and includes a first cutting side and a second cutting side which are parallel to the first and second edges, the third and fourth edges are located between the first and second edges;

a chip disposed on the working area and including two long sides, an active surface and a plurality of first bumps, the two long sides of the chip are parallel to the first and second edges, the active surface of the chip is faced toward the upper surface of the flexible substrate, the plurality of first bumps are disposed on the active surface, arranged along and nearby one of the two long sides;

a first test area located within the non-working area and between the third edge and the working area;

a plurality of first test pads arranged on the first test area along the third edge;

a circuit layer disposed on the upper surface and including a plurality of first outer lines, a plurality of first circuit lines and a plurality of first extension lines, the plurality of first outer lines are arranged along and nearby the first cutting side of the working area, one end of each of the plurality of first circuit lines is connected to one of the plurality of first bumps, the other end of each of the plurality of first circuit lines is connected to one end of one of the plurality of first outer lines, one end of each of the plurality of first extension lines is connected to the other end of one of the plurality of first outer lines, and the other end of each of the plurality of first extension lines is connected to one of the plurality of first test pads; and a second test area and a plurality of third test pads, wherein the second test area is located within the non-working area and between the second edge and the second cutting side of the working area, the plurality of third test pads are arranged on the second test area along the second edge, the chip further includes a plurality of second bumps which are disposed on the active surface, arranged along and nearby the other long side, the circuit layer further includes a plurality of second outer lines, a plurality of second circuit lines and a plurality of second extension lines, the plurality of second outer lines are arranged along and nearby the second cutting side of the working area, one end of each of the plurality of second circuit lines is connected to one of the plurality of second bumps, the other end of each of the plurality of second circuit lines is connected to one end of one of the plurality of second outer lines, one end of each of the plurality of second extension lines is connected to the other end of one of the plurality of second outer lines, and the other end of each of the plurality of second extension lines is connected to one of the plurality of third test pads.

2. The flexible circuit board in accordance with claim 1 further comprising a plurality of second test pads, wherein the plurality of second test pads are arranged on the first test area along the third edge, the chip further includes a plurality of second bumps which are disposed on the active surface, arranged along and nearby the other long side, the circuit layer further includes a plurality of second outer lines, a plurality of second circuit lines and a plurality of second extension lines, the plurality of second outer lines are arranged along and nearby the second cutting side of the working area, one end of each of the plurality of second circuit lines is connected to one of the plurality of second bumps, the other end of each of the plurality of second circuit lines is connected to one end of one of the plurality of second outer lines, one end of each of the plurality of second extension lines is connected to the other end of one of the plurality of second outer lines, and the other end of each of the plurality of second extension lines is connected to one of the plurality of second test pads.

3. The flexible circuit board in accordance with claim 1, wherein a plurality of flexible circuit boards are connected with each other as a reel, the first and second test areas of the adjacent flexible circuit boards are mirror symmetric about a connection edge between the adjacent flexible circuit boards.

4. The flexible circuit board in accordance with claim 1 further comprising a third test area and a plurality of fourth test pads, wherein the third test area is located within the non-working area and between the fourth edge and the working area, the plurality of fourth test pads are arranged on the third test area along the fourth edge, the circuit layer further includes a plurality of third extension lines, one end of each of the plurality of third extension lines is connected to the other end of one of the plurality of first outer lines, and the other end of each of the plurality of third extension lines is connected to one of the plurality of fourth test pads.

5. The flexible circuit board in accordance with claim 4 further comprising a plurality of second test pads, wherein the plurality of second test pads are arranged on the first test area along the third edge, the chip further includes a plurality of second bumps which are disposed on the active surface, arranged along and nearby the other long side, the circuit layer further includes a plurality of second outer lines, a plurality of second circuit lines and a plurality of second extension lines, the plurality of second outer lines are arranged along and nearby the second cutting side of the working area, one end of each of the plurality of second circuit lines is connected to one of the plurality of second bumps, the other end of each of the plurality of second circuit lines is connected to one end of one of the plurality of second outer lines, one end of each of the plurality of second extension lines is connected to the other end of one of the plurality of second outer lines, and the other end of each of the plurality of second extension lines is connected to one of the plurality of second test pads.

6. The flexible circuit board in accordance with claim 4, wherein a plurality of flexible circuit boards are connected with each other as a reel, the first, second and third test areas of the adjacent flexible circuit boards are mirror symmetric about a connection edge between the adjacent flexible circuit boards.

7. The flexible circuit board in accordance with claim 5 further comprising a plurality of fifth test pads, wherein the plurality of fifth test pads are arranged on the third test area along the fourth edge, the circuit layer further includes a plurality of fourth extension lines, one end of each of the plurality of fourth extension lines is connected to the other end of one of the plurality of second outer lines, and the other end of each of the plurality of fourth extension lines is connected to one of the plurality of fifth test pads.

8. A flexible circuit board comprising:

a flexible substrate including an upper surface and first to fourth edges, a working area and a non-working area are defined on the upper surface, the working area is surrounded by the non-working area and includes a first cutting side and a second cutting side which are parallel to the first and second edges, the third and fourth edges are located between the first and second edges;

a chip disposed on the working area and including two long sides, an active surface and a plurality of first bumps, the two long sides of the chip are parallel to the first and second edges, the active surface of the chip is faced toward the upper surface of the flexible substrate, the plurality of first bumps are disposed on the active surface, arranged along and nearby one of the two long sides;

a first test area located within the non-working area and between the third edge and the working area;

a plurality of first test pads arranged on the first test area along the third edge;

a circuit layer disposed on the upper surface and including a plurality of first outer lines, a plurality of first circuit lines and a plurality of first extension lines, the plurality of first outer lines are arranged along and nearby the first cutting side of the working area, one end of each of the plurality of first circuit lines is connected to one of the plurality of first bumps, the other end of each of the plurality of first circuit lines is connected to one end of one of the plurality of first outer lines, one end of each of the plurality of first extension lines is connected to the other end of one of the plurality of first outer lines, and the other end of each of the plurality of first extension lines is connected to one of the plurality of first test pads;

the third test area is located within the non-working area and between the fourth edge and the working area;

the plurality of fourth test pads are arranged on the third test area along the fourth edge, the circuit layer further includes a plurality of third extension lines, one end of each of the plurality of third extension lines is connected to the other end of one of the plurality of first outer lines, and the other end of each of the plurality of third extension lines is connected to one of the plurality of fourth test pads;

a plurality of second test pads, wherein the plurality of second test pads are arranged on the first test area along the third edge, the chip further includes a plurality of second bumps which are disposed on the active surface, arranged along and nearby the other long side, the circuit layer further includes a plurality of second outer lines, a plurality of second circuit lines and a plurality of second extension lines, the plurality of second outer lines are arranged along and nearby the second cutting side of the working area, one end of each of the plurality of second circuit lines is connected to one of the plurality of second bumps, the other end of each of the plurality of second circuit lines is connected to one end of one of the plurality of second outer lines, one end of each of the plurality of second extension lines is connected to the other end of one of the plurality of second outer lines, and the other end of each of the plurality of second extension lines is connected to one of the plurality of second test pads.

9. The flexible circuit board in accordance with claim 8 further comprising a plurality of fifth test pads, wherein the plurality of fifth test pads are arranged on the third test area along the fourth edge, the circuit layer further includes a plurality of fourth extension lines, one end of each of the plurality of fourth extension lines is connected to the other end of one of the plurality of second outer lines, and the other end of each of the plurality of fourth extension lines is connected to one of the plurality of fifth test pads.

10. The flexible circuit board in accordance with claim 8 further comprising a second test area and a plurality of third test pads, wherein the second test area is located within the non-working area and between the second edge and the second cutting side of the working area, the plurality of third test pads are arranged on the second test area along the second edge, the chip further includes a plurality of second bumps which are disposed on the active surface, arranged along and nearby the other long side, the circuit layer further includes a plurality of second outer lines, a plurality of second circuit lines and a plurality of second extension lines, the plurality of second outer lines are arranged along and nearby the second cutting side of the working area, one end of each of the plurality of second circuit lines is connected to one of the plurality of second bumps, the other end of each of the plurality of second circuit lines is connected to one end of one of the plurality of second outer lines, one end of each of the plurality of second extension lines is connected to the other end of one of the plurality of second outer lines, and the other end of each of the plurality of second extension lines is connected to one of the plurality of third test pads.

11. The flexible circuit board in accordance with claim 10, wherein a plurality of flexible circuit boards are connected with each other as a reel, the first, second and third test areas of the adjacent flexible circuit boards are mirror symmetric about a connection edge between the adjacent flexible circuit boards.

* * * * *